(12) United States Patent
Hart et al.

(10) Patent No.: US 8,212,432 B2
(45) Date of Patent: Jul. 3, 2012

(54) SAFETY INTERLOCKS FOR ELECTRICITY METER CONTROL RELAYS

(75) Inventors: David G. Hart, Raleigh, NC (US); Charles H. Jones, Raleigh, NC (US)

(73) Assignee: Elster Solutions, LLC, Raleigh, NC (US)

( * ) Notice: Subject to any disclaimer, the term of this patent is extended or adjusted under 35 U.S.C. 154(b) by 318 days.

(21) Appl. No.: 12/696,971

(22) Filed: Jan. 29, 2010

(65) Prior Publication Data
US 2011/0187206 A1 Aug. 4, 2011

(51) Int. Cl.
*H01H 9/20* (2006.01)
*H01H 67/00* (2006.01)
*H01H 63/36* (2006.01)

(52) U.S. Cl. ...................................................... 307/328
(58) Field of Classification Search .................... 307/328
See application file for complete search history.

(56) References Cited

U.S. PATENT DOCUMENTS

| | | | |
|---|---|---|---|
| 5,572,429 A | 11/1996 | Hunter et al. | |
| 5,940,009 A * | 8/1999 | Loy et al. | 340/870.02 |
| 6,256,128 B1 | 7/2001 | Lavoie et al. | |
| 7,049,932 B2 * | 5/2006 | French et al. | 340/7.1 |
| 7,091,878 B2 * | 8/2006 | Holle et al. | 340/870.02 |
| 7,231,482 B2 * | 6/2007 | Leach | 710/305 |
| 7,397,652 B2 * | 7/2008 | Price et al. | 361/643 |
| 7,545,135 B2 * | 6/2009 | Holle et al. | 324/76.11 |
| 7,583,202 B2 | 9/2009 | Robinson et al. | |
| 7,772,829 B2 * | 8/2010 | Shuey | 324/142 |
| 2004/0150384 A1* | 8/2004 | Holle et al. | 324/110 |
| 2005/0125361 A1 | 6/2005 | Girsham et al. | |
| 2005/0134430 A1* | 6/2005 | French et al. | 340/7.1 |
| 2008/0094248 A1 | 4/2008 | Lakich | |
| 2008/0162930 A1 | 7/2008 | Finney et al. | |
| 2008/0177678 A1* | 7/2008 | Di Martini et al. | 705/412 |
| 2009/0167547 A1* | 7/2009 | Gilbert | 340/662 |
| 2009/0309756 A1* | 12/2009 | Mason et al. | 340/870.02 |
| 2010/0007522 A1* | 1/2010 | Morris | 340/870.02 |
| 2010/0145544 A1* | 6/2010 | Forbes et al. | 700/295 |
| 2011/0175453 A1* | 7/2011 | Batzler et al. | 307/68 |
| 2011/0242715 A1* | 10/2011 | Voisine et al. | 361/65 |

FOREIGN PATENT DOCUMENTS

JP 2007278980 A * 10/2007

* cited by examiner

*Primary Examiner* — Adi Amrany
(74) *Attorney, Agent, or Firm* — Woodcock Washburn LLP

(57) ABSTRACT

Safety in an electricity metering environment is improved by providing an additional level of safety interlocking to disconnect switches and other control relays in electricity meters.

22 Claims, 8 Drawing Sheets

SAFETY INTERLOCKS FOR ELECTRICITY METER CONTROL RELAYS

FIELD OF THE INVENTION

This invention relates generally to electricity metering and, more specifically, to electricity metering devices that have an internal control relay, such as a disconnect switch or an auxiliary control relay.

BACKGROUND

For a variety of reasons, electrical utilities are routinely and frequently required to connect and disconnect service at subscriber locations. For example, a utility may need to disconnect service when a subscriber moves out of a particular location and then later reconnect service to the same location when another subscriber moves in. Likewise, utility companies are sometimes forced to disconnect service to a subscriber who does not pay, and then reconnect service when the subscriber's account is settled. There may be other reasons for disconnecting service at a subscriber location as well, such as to enable maintenance or repair.

A number of electricity metering devices currently exist that provide connect/disconnect capability through the use of a control relay, commonly referred to as a disconnect switch, internal to the meter. Electricity meters also often incorporate auxiliary control relays that can be operated to connect/disconnect particular types of devices, such as electric water heaters or other equipment.

In the past, disconnect switches at the electricity meter were operated manually. Today, however, utilities are able to operate service disconnect switches and auxiliary control relays remotely. For example, in a system in which electricity meters communicate with a utility control station via a wired or wireless network, the disconnect switch and/or auxiliary control relays in a meter can be controlled by transmitting a command or request via the network to the meter, which responds by opening or closing the disconnect switch or other control relay as requested. Alternatively, commands or requests to open or close a disconnect switch or other control relay may be received from a hand-held programming unit. Some hand-held programming units are designed to communicate with the meter via an optical port interface on the meter, whereas others are designed to communicate with the meter via the meter's wireless communications circuitry. Such commands or requests may also be received from other devices or sources via an option board that may be installed in the meter.

Regardless of the source of a remote request or command to open or close a disconnect switch or other control relay, there may be times when doing so would create unsafe or undesired conditions at the electricity meter. For example, if a disconnect switch or other control relay has been opened for some reason and a technician has been dispatched to the subscriber location, an unexpected closure of the switch or other control relay may result in harm to the technician. An unexpected interruption of service as a result of opening a disconnect switch or other control relay could also be problematic for certain residents, such as the elderly or those undergoing medical treatment, particularly when medical equipment must remain powered. In all such cases, safety is a significant concern.

SUMMARY OF THE INVENTION

Safety is improved by providing an additional level of safety interlocking to disconnect switches and other control relays in an electricity meter. In one embodiment, an electricity meter comprises a processor, a memory, a communication interface, and at least one control relay that has a first state in which the control relay is open and a second state in which the control relay is closed. The state of the control relay is controlled by the processor.

A request may be received via the communications interface to change the state of the at least one control relay. In response to the request, the state of a safety interlock flag stored in the memory of the electricity meter may be checked. The safety interlock flag indicates whether or not changes to the state of the at least one control relay are permitted. If the state of the safety interlock flag indicates that changes are permitted, then the state of the at least one control relay may then be changed in response to the received request. If the flag indicates that changes to the state of the control relay are not permitted, then the state of the control relay is not changed as requested.

Other features of the methods and apparatus disclosed herein will become evident from the following description and accompanying figures.

BRIEF DESCRIPTION OF THE DRAWINGS

The foregoing summary, as well as the following detailed description of the invention, is better understood when read in conjunction with the appended drawings. For the purpose of illustrating the invention, there is shown in the drawings exemplary embodiments of various aspects of the invention; however, the invention is not limited to the specific methods and instrumentalities disclosed. In the drawings.

DETAILED DESCRIPTION OF ILLUSTRATIVE EMBODIMENTS

Figure 1:
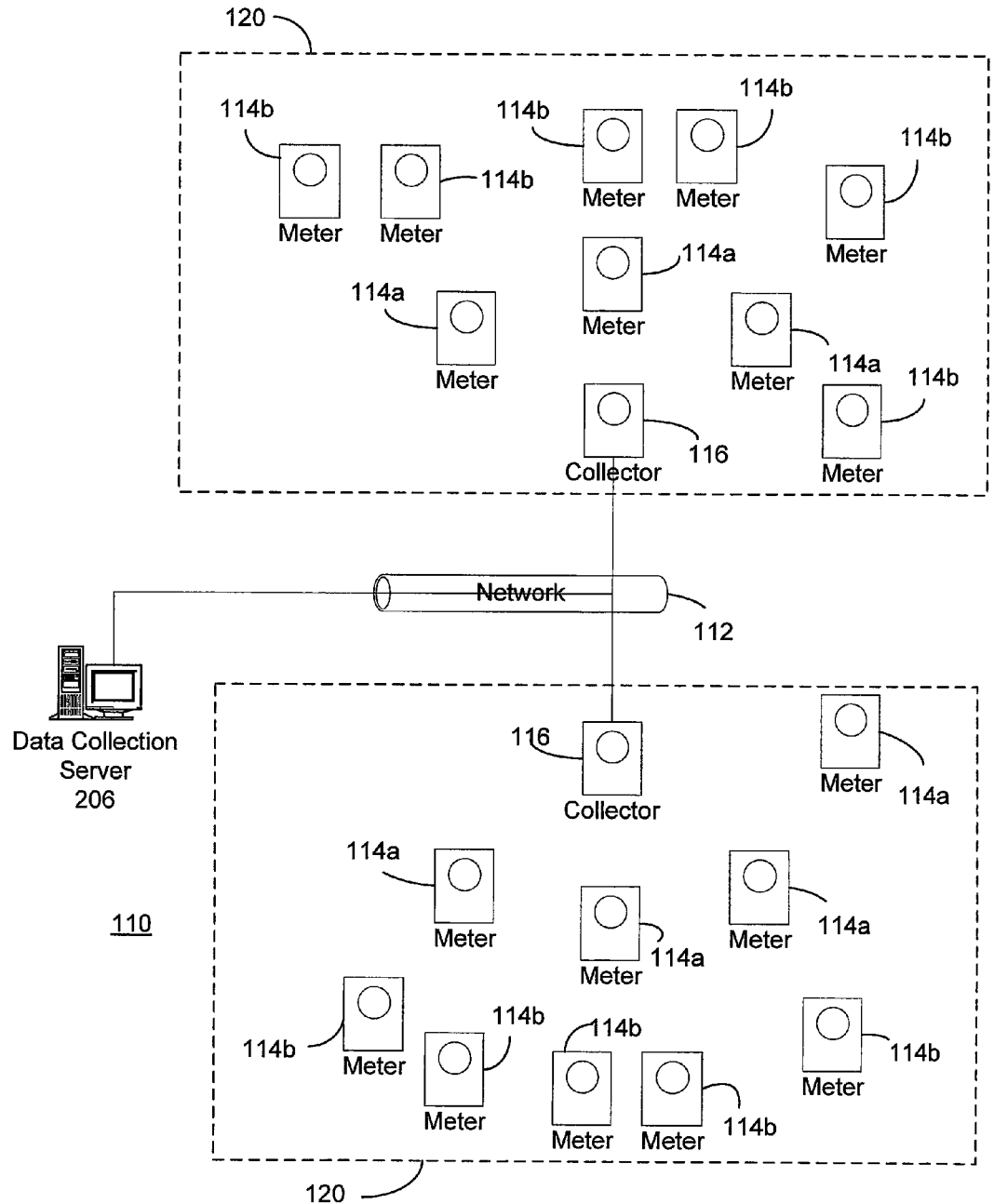
FIG. 1 is a diagram of an exemplary metering system employing wireless networking.

The methods and apparatus described herein provide an additional level of safety interlocking to disconnect switches and other control relays in an electricity meter environment. Exemplary embodiments of these methods and apparatus are provided below, but it is understood that the invention is not limited to those specific embodiments. While certain details have been provided to illustrate the embodiments described below, it is understood that the invention may be practiced without those specific details. Acronyms and other terms may be used in the following description, however they are not intended to limit the scope of the invention as defined by the appended claims.

Exemplary Metering System

One example of a metering system 110 in which the safety interlocking methods and apparatus described herein may be employed is illustrated in FIGS. 1, 2 and 3A-B. The description given herein with respect to those figures is for exemplary purposes only and is not intended in any way to limit the scope of potential embodiments.

System 110 comprises a plurality of meters 114, which are operable to sense and record consumption or usage of a service or commodity such as, for example, electricity, water, or gas. Meters 114 may be located at customer premises such as, for example, a home or place of business. Meters 114 comprise circuitry for measuring the consumption of the service or commodity being consumed at their respective locations and for generating data reflecting the consumption, as well as other data related thereto. Meters 114 may also comprise circuitry for wirelessly transmitting data generated by the meter to a remote location. Meters 114 may further comprise circuitry for receiving data, commands or instructions wirelessly as well. Meters that are operable to both receive and transmit data may be referred to as "bi-directional" or "two-way" meters (or nodes), while meters that are only capable of transmitting data may be referred to as "transmit-only" or "one-way" meters. In bi-directional meters, the circuitry for transmitting and receiving may comprise a transceiver. In an illustrative embodiment, meters 114 may be, for example, electricity meters manufactured by Elster Solutions, LLC and marketed under the trade name REX.

System 110 further comprises collectors 116. In one embodiment, collectors 116 are also meters operable to detect and record usage of a service or commodity such as, for example, electricity, water, or gas. In addition, collectors 116 are operable to send data to and receive data from meters 114. Thus, like the meters 114, the collectors 116 may comprise both circuitry for measuring the consumption of a service or commodity and for generating data reflecting the consumption and circuitry for transmitting and receiving data. In one embodiment, collector 116 and meters 114 communicate with and amongst one another using any one of several wireless techniques such as, for example, frequency hopping spread spectrum (FHSS) or direct sequence spread spectrum (DSSS). Collectors 116 are also sometimes referred to as "gatekeepers."

A collector 116 and the meters 114 with which it communicates define a subnet or local area network (LAN) 120 of system 110. As used herein, a collector 116 and the meters 114 with which it communicates may be referred to as "nodes" in the subnet/LAN 120. In each subnet/LAN 120, each meter transmits data related to consumption of the commodity being metered at the meter's location. The collector 116 receives the data transmitted by each meter 114, effectively "collecting" it, and then periodically transmits the data from all of the meters in the subnet/LAN 120 to a data collection server 206. The data collection server 206 stores the data for analysis and preparation of bills, for example. The data collection server 206 may be a specially programmed general purpose computing system and may communicate with collectors 116 via a network 112. The network 112 may comprise any form of network, including a wireless network or a fixed-wire network, such as a local area network (LAN), a wide area network, the Internet, an intranet, a telephone network, such as the public switched telephone network (PSTN), a Frequency Hopping Spread Spectrum (FHSS) radio network, a mesh network, a Wi-Fi (802.11) network, a Wi-Max (802.16) network, a land line (POTS) network, or any combination of the above.

Figure 2:
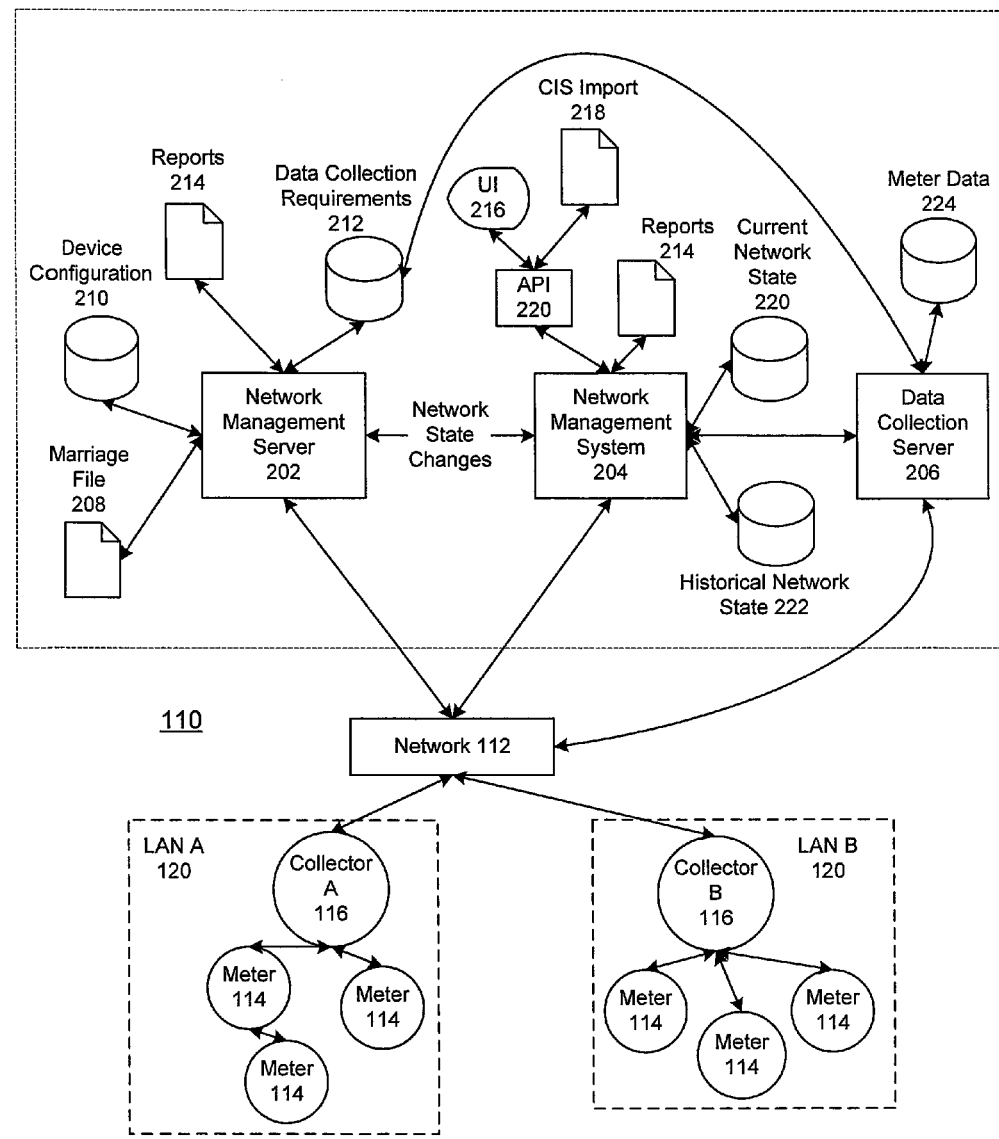
FIG. 2 expands upon the diagram of FIG. 1 and illustrates an exemplary metering system in greater detail.

Referring now to FIG. 2, further details of the metering system 110 are shown. Typically, the system will be operated by a utility company or a company providing information technology services to a utility company. As shown, the system 110 comprises a network management server 202, a network management system (NMS) 204 and the data collection server 206 that together manage one or more subnets/LANs 120 and their constituent nodes. The NMS 204 tracks changes in network state, such as new nodes registering/unregistering with the system 110, node communication paths changing, etc. This information is collected for each subnet/LAN 120 and is detected and forwarded to the network management server 202 and data collection server 206.

Each of the meters 114 and collectors 116 is assigned an identifier (LAN ID) that uniquely identifies that meter or collector on its subnet/LAN 120. In this embodiment, communication between nodes (i.e., the collectors and meters) and the system 110 is accomplished using the LAN ID. However, it is preferable for operators of a utility to query and communicate with the nodes using their own identifiers. To this end, a marriage file 208 may be used to correlate a utility's identifier for a node (e.g., a utility serial number) with both a manufacturer serial number (i.e., a serial number assigned by the manufacturer of the meter) and the LAN ID for each node in the subnet/LAN 120. In this manner, the utility can refer to the meters and collectors by the utilities identifier, while the system can employ the LAN ID for the purpose of designating particular meters during system communications.

A device configuration database 210 stores configuration information regarding the nodes. For example, in the metering system 110, the device configuration database may include data regarding time of use (TOU) switchpoints, etc. for the meters 114 and collectors 116 communicating in the system 110. A data collection requirements database 212 contains information regarding the data to be collected on a per node basis. For example, a utility may specify that metering data such as load profile, demand, TOU, etc. is to be collected from particular meter(s) 114a. Reports 214 containing information on the network configuration may be automatically generated or in accordance with a utility request.

The network management system (NMS) 204 maintains a database describing the current state of the global fixed network system (current network state 220) and a database describing the historical state of the system (historical network state 222). The current network state 220 contains data regarding current meter-to-collector assignments, etc. for each subnet/LAN 120. The historical network state 222 is a database from which the state of the network at a particular point in the past can be reconstructed. The NMS 204 is responsible for, amongst other things, providing reports 214 about the state of the network. The NMS 204 may be accessed via an API 220 that is exposed to a user interface 216 and a Customer Information System (CIS) 218. Other external interfaces may also be implemented. In addition, the data collection requirements stored in the database 212 may be set via the user interface 216 or CIS 218.

The data collection server 206 collects data from the nodes (e.g., collectors 116) and stores the data in a database 224. The data includes metering information, such as energy consumption, and may be used for billing purposes, etc. by a utility provider.

The network management server 202, network management system 204 and data collection server 206 communicate with the nodes in each subnet/LAN 120 via network 112.

Figure 3A:
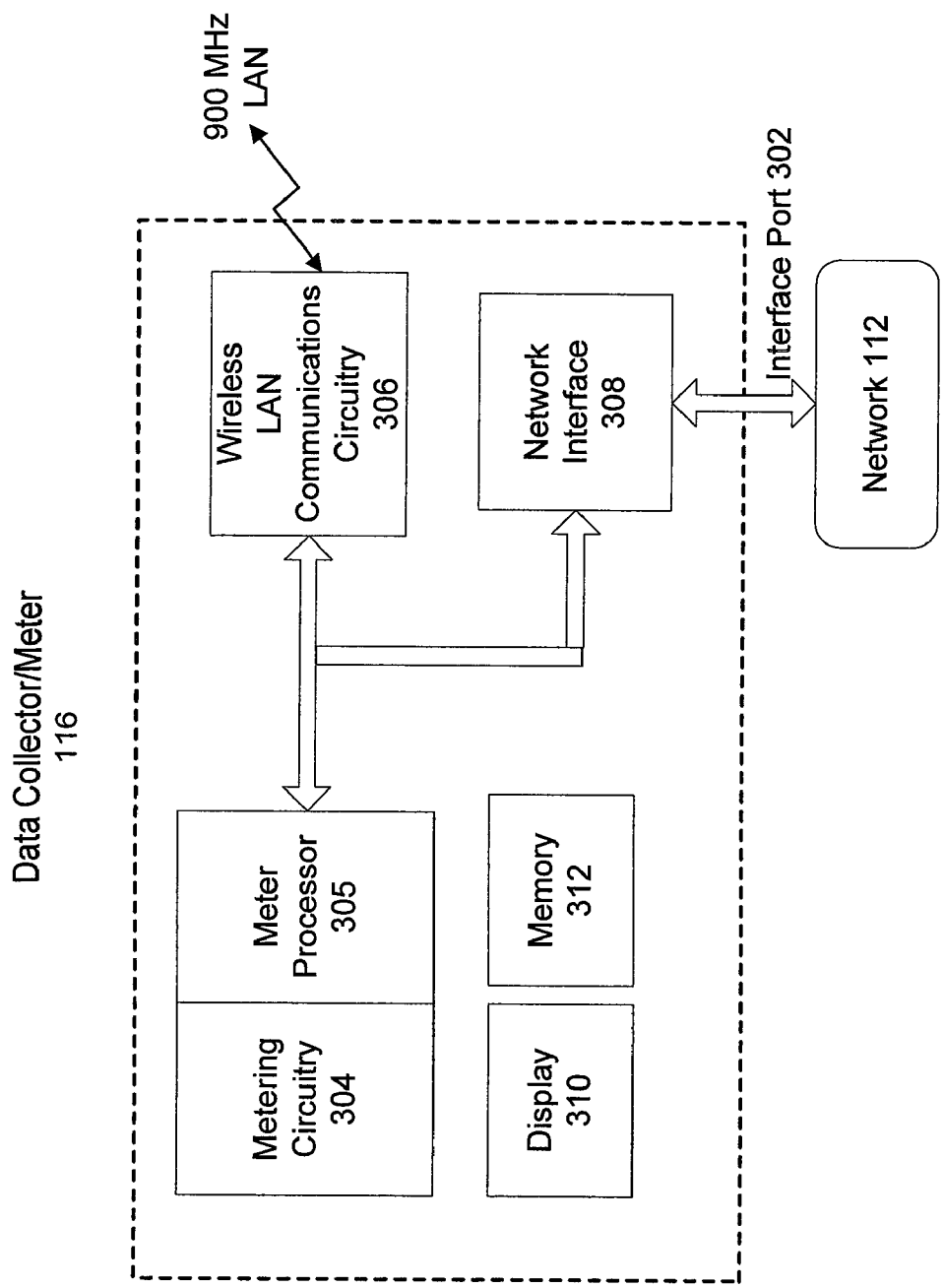
FIG. 3A is a block diagram illustrating an exemplary collector.

FIG. 3A is a block diagram illustrating further details of one embodiment of a collector 116. Although certain components are designated and discussed with reference to FIG. 3A, it should be appreciated that such designations and discussion are not limiting. In fact, various other components typically found in an electronic meter may be a part of collector 116, but have not been shown in FIG. 3A for the purposes of clarity and brevity. Also, other components may be used to accomplish the operation of collector 116. The components that are shown and the functionality described for collector 116 are provided as examples, and are not meant to be exclusive of other components or other functionality.

As shown in FIG. 3A, collector 116 may comprise metering circuitry 304 that performs measurement of consumption of a service or commodity and a processor 305 that controls the overall operation of the metering functions of the collector 116. The collector 116 may further comprise a display 310 for displaying information such as measured quantities and meter status and a memory 312 for storing data. The collector 116 further comprises wireless LAN communications circuitry 306 for communicating wirelessly with the meters 114 in a subnet/LAN and a network interface 308 for communication over the network 112.

In one embodiment, the metering circuitry 304, processor 305, display 310 and memory 312 are implemented using an A3 ALPHA meter available from Elster Solutions, LLC. In that embodiment, the wireless LAN communications circuitry 306 may be implemented by a LAN Option Board (e.g., a 900 MHz two-way radio) installed within the A3 ALPHA meter, and the network interface 308 may be implemented by a WAN Option Board (e.g., a telephone modem) also installed within the A3 ALPHA meter. In this embodiment, the WAN Option Board 308 routes messages from network 112 (via interface port 302) to either the meter processor 305 or the LAN Option Board 306. LAN Option Board 306 may use a transceiver (not shown), for example a 900 MHz radio, to communicate data to meters 114. Also, LAN Option Board 306 may have sufficient memory to store data received from meters 114. This data may include, but is not limited to the following: current billing data (e.g., the present values stored and displayed by meters 114), previous billing period data, previous season data, and load profile data.

LAN Option Board 306 may be capable of synchronizing its time to a real time clock (not shown) in A3 ALPHA meter, thereby synchronizing the LAN reference time to the time in the meter. The processing necessary to carry out the communication functionality and the collection and storage of metering data of the collector 116 may be handled by the processor 305 and/or additional processors (not shown) in the LAN Option Board 306 and the WAN Option Board 308.

The responsibility of a collector 116 is wide and varied. Generally, collector 116 is responsible for managing, processing and routing data communicated between the collector and network 112 and between the collector and meters 114. Collector 116 may continually or intermittently read the current data from meters 114 and store the data in a database (not shown) in collector 116. Such current data may include but is not limited to the total kWh usage, the Time-Of-Use (TOU) kWh usage, peak kW demand, and other energy consumption measurements and status information. Collector 116 also may read and store previous billing and previous season data from meters 114 and store the data in the database in collector 116. The database may be implemented as one or more tables of data within the collector 116.

In one embodiment, the LAN Option Board 306 employs a CC1110 chip available from Texas Instruments, Inc. to implement its wireless transceiver functionality. The CC1110 chip has a built-in Received Signal Strength Indication (RSSI) capability that provides a measurement of the power present in a received radio signal.

Figure 3B:
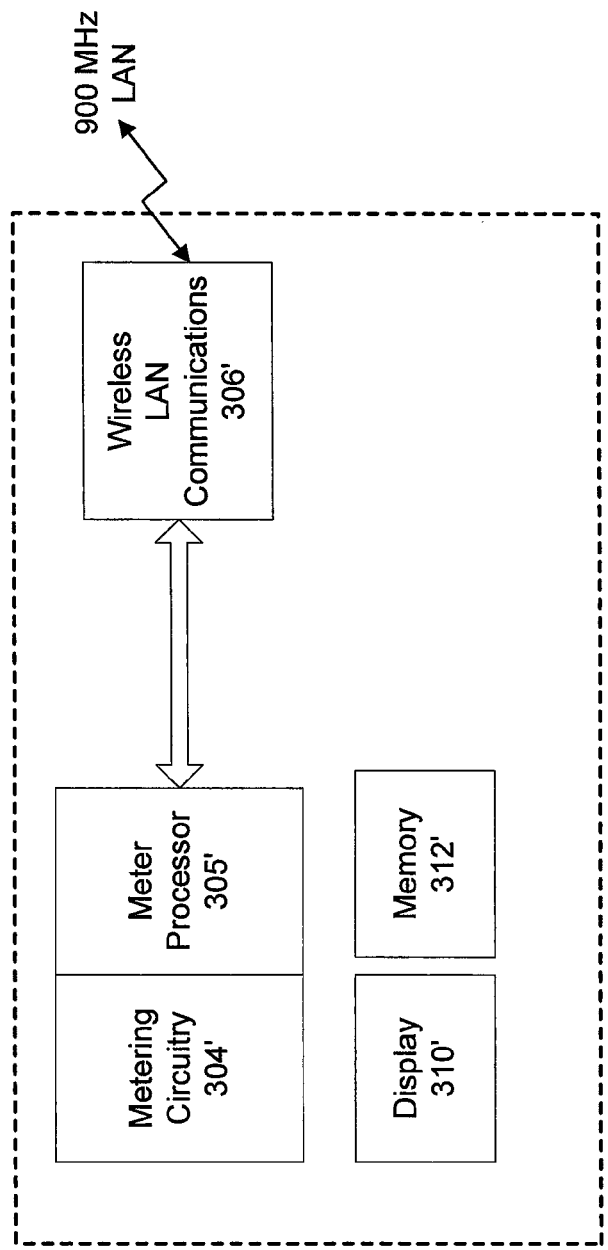
FIG. 3B is a block diagram illustrating an exemplary electricity meter.

FIG. 3B is a block diagram of an exemplary embodiment of a meter 114 that may operate in the system 110 of FIGS. 1 and 2. As shown, the meter 114 comprises metering circuitry 304' for measuring the amount of a service or commodity that is consumed, a processor 305' that controls the overall functions of the meter, a display 310' for displaying meter data and status information, and a memory 312' for storing data and program instructions. The meter 114 further comprises wireless communications circuitry 306' for transmitting and receiving data to/from other meters 114 or a collector 116. The wireless communication circuitry 306' may comprise, for example, the aforementioned CC1110 chip available from Texas Instruments, Inc.

Referring again to FIG. 1, in one embodiment, a collector 116 directly communicates with only a subset of the plurality of meters 114 in its particular subnet/LAN. Meters 114 with which collector 116 directly communicates may be referred to as "level one" meters 114a. The level one meters 114a are said to be one "hop" from the collector 116. Communications between collector 116 and meters 114 other than level one meters 114a are relayed through the level one meters 114a. Thus, the level one meters 114a operate as repeaters for communications between collector 116 and meters 114 located further away in subnet 120.

Each level one meter 114a typically will only be in range to directly communicate with only a subset of the remaining meters 114 in the subnet 120. The meters 114 with which the level one meters 114a directly communicate may be referred to as level two meters 114b. Level two meters 114b are one "hop" from level one meters 114a, and therefore two "hops" from collector 116. Level two meters 114b operate as repeaters for communications between the level one meters 114a and meters 114 located further away from collector 116 in the subnet 120.

While only three levels of meters are shown (collector 116, first level 114a, second level 114b) in FIG. 1, a subnet 120 may comprise any number of levels of meters 114. For example, a subnet 120 may comprise one level of meters but might also comprise eight, sixteen, thirty-two or even more levels of meters 114. In an embodiment, as many as 2048 or more meters may be registered with a single collector 116.

As mentioned above, in one embodiment, each meter 114 and collector 116 that is installed in the system 110 has a unique identifier (LAN ID) stored thereon that uniquely identifies the device from all other devices in the system 110. Additionally, meters 114 operating in a subnet 120 comprise information including the following: data identifying the collector with which the meter is registered; the level in the subnet at which the meter is located; the repeater meter at the prior level with which the meter communicates to send and receive data to/from the collector; an identifier indicating whether the meter is a repeater for other nodes in the subnet; and if the meter operates as a repeater, the identifier that uniquely identifies the repeater within the particular subnet, and the number of meters for which it is a repeater. In one embodiment, collectors 116 have stored thereon this same data for meters 114 that are registered therewith. Thus, collector 116 comprises data identifying the nodes registered therewith as well as data identifying the registered path by which data is communicated from the collector to each such node. Each meter 114 therefore has a designated communications path to the collector that is either a direct path (e.g., all level one nodes) or an indirect path through one or more intermediate nodes that serve as repeaters.

In one embodiment, information is transmitted in the form of packets. For most network tasks such as, for example, reading meter data, collector 116 communicates with meters 114 in the subnet 120 using point-to-point transmissions. For example, a message or instruction from collector 116 may be routed through the designated set of repeaters to the desired meter 114. Similarly, a meter 114 may communicate with collector 116 through the same set of repeaters, but in reverse.

In some instances, however, collector 116 may need to quickly communicate information to all meters 114 located in its subnet 120. Accordingly, collector 116 may issue a broadcast message that is meant to reach all nodes in the subnet 120. The broadcast message may be referred to as a "flood broadcast message." A flood broadcast originates at collector 116 and propagates through the entire subnet 120 one level at a time. For example, collector 116 may transmit a flood broadcast to all first level meters 114a. The first level meters 114a that receive the message pick a random time slot and retransmit the broadcast message to second level meters 114b. Any second level meter 114b can accept the broadcast, thereby providing better coverage from the collector out to the end point meters. Similarly, the second level meters 114b that receive the broadcast message pick a random time slot and communicate the broadcast message to third level meters. This process continues out until the end nodes of the subnet. Thus, a broadcast message gradually propagates outward from the collector to the nodes of the subnet 120.

The flood broadcast packet header contains information to prevent nodes from repeating the flood broadcast packet more than once per level. For example, within a flood broadcast message, a field might exist that indicates to meters/nodes which receive the message, the level of the subnet the message is located; only nodes at that particular level may re-broadcast the message to the next level. If the collector broadcasts a flood message with a level of 1, only level 1 nodes may respond. Prior to re-broadcasting the flood message, the level 1 nodes increment the field to 2 so that only level 2 nodes respond to the broadcast. Information within the flood broadcast packet header ensures that a flood broadcast will eventually die out.

Generally, a collector 116 issues a flood broadcast several times, e.g. five times, successively to increase the probability that all meters in the subnet 120 receive the broadcast. A delay is introduced before each new broadcast to allow the previous broadcast packet time to propagate through all levels of the subnet.

Meters 114 may have a clock formed therein. However, meters 114 often undergo power interruptions that can interfere with the operation of any clock therein. Accordingly, it may not be possible to rely upon the clocks internal to meters 114 to provide accurate time readings. Having the correct time may be necessary, however, when time of use metering is being employed. Indeed, in an embodiment, time of use schedule data may also be comprised in the same broadcast message as the time. Accordingly, collector 116 periodically flood broadcasts the real time to meters 114 in subnet 120. Meters 114 use the time broadcasts to stay synchronized with the rest of the subnet 120. In an illustrative embodiment, collector 116 broadcasts the time every 15 minutes. The broadcasts may be made near the middle of 15 minute clock boundaries that are used in performing load profiling and time of use (TOU) schedules so as to minimize time changes near these boundaries. Maintaining time synchronization is important to the proper operation of the subnet 120. Accordingly, lower priority tasks performed by collector 116 may be delayed while the time broadcasts are performed.

In an illustrative embodiment, the flood broadcasts transmitting time data may be repeated, for example, five times, so as to increase the probability that all nodes receive the time. Furthermore, where time of use schedule data is communicated in the same transmission as the timing data, the subsequent time transmissions allow a different piece of the time of use schedule to be transmitted to the nodes.

Exception messages may be used in subnet 120 to transmit unexpected events that occur at meters 114 to collector 116. In an embodiment, the first 4 seconds of every 32-second period may be allocated as an exception window for meters 114 to transmit exception messages. Meters 114 may transmit their exception messages early enough in the exception window so the message has time to propagate to collector 116 before the end of the exception window. Collector 116 may process the exceptions after the 4-second exception window. Generally, a collector 116 acknowledges exception messages, and the collector 116 waits until the end of the exception window to send this acknowledgement.

In an illustrative embodiment, exception messages may be configured as one of three different types of exception messages: local exceptions, which are handled directly by the collector 116 without intervention from data collection server 206; an immediate exception, which is generally relayed to data collection server 206 under an expedited schedule; and a daily exception, which is communicated to the data collection server 206 on a regular schedule.

Exceptions are processed as follows. When an exception is received at collector 116, the collector 116 identifies the type of exception that has been received. If a local exception has been received, collector 116 takes an action to remedy the problem. For example, when collector 116 receives an exception requesting a "node scan request" such as discussed below, collector 116 transmits a command to initiate a scan procedure to the meter 114 from which the exception was received.

If an immediate exception type has been received, collector 116 makes a record of the exception. An immediate exception might identify, for example, that there has been a power outage. Collector 116 may log the receipt of the exception in one or more tables or files. In an illustrative example, a record of receipt of an immediate exception is made in a table referred to as the "Immediate Exception Log Table." Collector 116 then waits a set period of time before taking further action with respect to the immediate exception. For example, collector 116 may wait 64 seconds. This delay period allows the exception to be corrected before communicating the exception to the data collection server 206. For example, where a power outage was the cause of the immediate exception, collector 116 may wait a set period of time to allow for receipt of a message indicating the power outage has been corrected.

If the exception has not been corrected, collector 116 communicates the immediate exception to data collection server 206. For example, collector 116 may initiate a dial-up connection with data collection server 206 and download the exception data. After reporting an immediate exception to data collection server 206, collector 116 may delay reporting any additional immediate exceptions for a period of time such as ten minutes. This is to avoid reporting exceptions from other meters 114 that relate to, or have the same cause as, the exception that was just reported.

If a daily exception was received, the exception is recorded in a file or a database table. Generally, daily exceptions are occurrences in the subnet 120 that need to be reported to data collection server 206, but are not so urgent that they need to be communicated immediately. For example, when collector 116 registers a new meter 114 in subnet 120, collector 116 records a daily exception identifying that the registration has taken place. In an illustrative embodiment, the exception is recorded in a database table referred to as the "Daily Exception Log Table." Collector 116 communicates the daily exceptions to data collection server 206. Generally, collector 116 communicates the daily exceptions once every 24 hours.

In one embodiment, a collector may assign designated communications paths to meters with bi-directional communication capability, and may change the communication paths for previously registered meters if conditions warrant. For example, when a collector 116 is initially brought into system 110, it needs to identify and register meters in its subnet 120. A "node scan" refers to a process of communication between a collector 116 and meters 114 whereby the collector may identify and register new nodes in a subnet 120 and allow previously registered nodes to switch paths. A collector 116 can implement a node scan on the entire subnet, referred to as a "full node scan," or a node scan can be performed on specially identified nodes, referred to as a "single node scan."

A full node scan may be performed, for example, when a collector is first installed. The collector 116 must identify and register nodes from which it will collect usage data. The collector 116 initiates a node scan by broadcasting a request, which may be referred to as a Node Scan Procedure request. Generally, the Node Scan Procedure request directs that all unregistered meters 114 or nodes that receive the request respond to the collector 116. The request may comprise information such as the unique address of the collector that initiated the procedure. The signal by which collector 116 transmits this request may have limited strength and therefore is detected only at meters 114 that are in proximity of collector 116. Meters 114 that receive the Node Scan Procedure request respond by transmitting their unique identifier as well as other data.

For each meter from which the collector receives a response to the Node Scan Procedure request, the collector tries to qualify the communications path to that meter before registering the meter with the collector. That is, before registering a meter, the collector 116 attempts to determine whether data communications with the meter will be sufficiently reliable. In one embodiment, the collector 116 determines whether the communication path to a responding meter is sufficiently reliable by comparing a Received Signal Strength Indication (RSSI) value (i.e., a measurement of the received radio signal strength) measured with respect to the received response from the meter to a selected threshold value. For example, the threshold value may be −60 dBm. RSSI values above this threshold would be deemed sufficiently reliable. In another embodiment, qualification is performed by transmitting a predetermined number of additional packets to the meter, such as ten packets, and counting the number of acknowledgements received back from the meter. If the number of acknowledgments received is greater than or equal to a selected threshold (e.g., 8 out of 10), then the path is considered to be reliable. In other embodiments, a combination of the two qualification techniques may be employed.

If the qualification threshold is not met, the collector 116 may add an entry for the meter to a "Straggler Table." The entry includes the meter's LAN ID, its qualification score (e.g., 5 out of 10; or its RSSI value), its level (in this case level one) and the unique ID of its parent (in this case the collector's ID).

If the qualification threshold is met or exceeded, the collector 116 registers the node. Registering a meter 114 comprises updating a list of the registered nodes at collector 116. For example, the list may be updated to identify the meter's system-wide unique identifier and the communication path to the node. Collector 116 also records the meter's level in the subnet (i.e. whether the meter is a level one node, level two node, etc.), whether the node operates as a repeater, and if so, the number of meters for which it operates as a repeater. The registration process further comprises transmitting registration information to the meter 114. For example, collector 116 forwards to meter 114 an indication that it is registered, the unique identifier of the collector with which it is registered, the level the meter exists at in the subnet, and the unique identifier of its parent meter that will serve as a repeater for messages the meter may send to the collector. In the case of a level one node, the parent is the collector itself. The meter stores this data and begins to operate as part of the subnet by responding to commands from its collector 116.

Qualification and registration continues for each meter that responds to the collector's initial Node Scan Procedure request. The collector 116 may rebroadcast the Node Scan Procedure additional times so as to insure that all meters 114 that may receive the Node Scan Procedure have an opportunity for their response to be received and the meter qualified as a level one node at collector 116.

The node scan process then continues by performing a similar process as that described above at each of the now registered level one nodes. This process results in the identification and registration of level two nodes. After the level two nodes are identified, a similar node scan process is performed at the level two nodes to identify level three nodes, and so on.

Specifically, to identify and register meters that will become level two meters, for each level one meter, in succession, the collector 116 transmits a command to the level one meter, which may be referred to as an "Initiate Node Scan Procedure" command. This command instructs the level one meter to perform its own node scan process. The request comprises several data items that the receiving meter may use in completing the node scan. For example, the request may comprise the number of timeslots available for responding nodes, the unique address of the collector that initiated the request, and a measure of the reliability of the communications between the target node and the collector. As described below, the measure of reliability may be employed during a process for identifying more reliable paths for previously registered nodes.

The meter that receives the Initiate Node Scan Procedure request responds by performing a node scan process similar to that described above. More specifically, the meter broadcasts a request to which all unregistered nodes may respond. The request comprises the number of timeslots available for responding nodes (which is used to set the period for the node to wait for responses), the unique address of the collector that initiated the node scan procedure, a measure of the reliability of the communications between the sending node and the collector (which may be used in the process of determining whether a meter's path may be switched as described below), the level within the subnet of the node sending the request, and an RSSI threshold (which may also be used in the process of determining whether a registered meter's path may be switched). The meter issuing the node scan request then waits for and receives responses from unregistered nodes. For each response, the meter stores in memory the unique identifier of the responding meter. This information is then transmitted to the collector.

For each unregistered meter that responded to the node scan issued by the level one meter, the collector attempts again to determine the reliability of the communication path to that meter. In one embodiment, the collector sends a "Qualify Nodes Procedure" command to the level one node which instructs the level one node to transmit a predetermined number of additional packets to the potential level two node and to record the number of acknowledgements received back from the potential level two node. This qualification score (e.g., 8 out of 10) is then transmitted back to the collector, which again compares the score to a qualification threshold. In other embodiments, other measures of the communications reliability may be provided, such as an RSSI value.

If the qualification threshold is not met, then the collector adds an entry for the node in the Straggler Table, as discussed above. However, if there already is an entry in the Straggler Table for the node, the collector will update that entry only if the qualification score for this node scan procedure is better than the recorded qualification score from the prior node scan that resulted in an entry for the node.

If the qualification threshold is met or exceeded, the collector 116 registers the node. Again, registering a meter 114 at level two comprises updating a list of the registered nodes at collector 116. For example, the list may be updated to identify the meter's unique identifier and the level of the meter in the subnet. Additionally, the collector's 116 registration information is updated to reflect that the meter 114 from which the scan process was initiated is identified as a repeater (or parent) for the newly registered node. The registration process further comprises transmitting information to the newly registered meter as well as the meter that will serve as a repeater for the newly added node. For example, the node that issued the Initiate Node Scan Procedure request is updated to identify that it operates as a repeater and, if it was previously registered as a repeater, increments a data item identifying the number of nodes for which it serves as a repeater. Thereafter, collector 116 forwards to the newly registered meter an indication that it is registered, an identification of the collector 116 with which it is registered, the level the meter exists at in the subnet, and the unique identifier of the node that will serve as its parent, or repeater, when it communicates with the collector 116.

The collector then performs the same qualification procedure for each other potential level two node that responded to the level one node's node scan request. Once that process is completed for the first level one node, the collector initiates the same procedure at each other level one node until the process of qualifying and registering level two nodes has been completed at each level one node. Once the node scan procedure has been performed by each level one node, resulting in a number of level two nodes being registered with the collector, the collector will then send the Initiate Node Scan Procedure request to each level two node, in turn. Each level two node will then perform the same node scan procedure as performed by the level one nodes, potentially resulting in the registration of a number of level three nodes. The process is then performed at each successive node, until a maximum number of levels is reached (e.g., seven levels) or no unregistered nodes are left in the subnet.

It will be appreciated that in the present embodiment, during the qualification process for a given node at a given level, the collector qualifies the last "hop." For example, if an unregistered node responds to a node scan request from a level four node, and therefore, becomes a potential level five node, the qualification score for that node is based on the reliability of communications between the level four node and the potential level five node (i.e., packets transmitted by the level four node versus acknowledgments received from the potential level five node), not based on any measure of the reliability of the communications over the full path from the collector to the potential level five node. In other embodiments, of course, the qualification score could be based on the full communication path.

At some point, each meter will have an established communication path to the collector which will be either a direct path (i.e., level one nodes) or an indirect path through one or more intermediate nodes that serve as repeaters. If during operation of the network, a meter registered in this manner fails to perform adequately, it may be assigned a different path or possibly to a different collector as described below.

As previously mentioned, a full node scan may be performed when a collector 116 is first introduced to a network. At the conclusion of the full node scan, a collector 116 will have registered a set of meters 114 with which it communicates and reads metering data. Full node scans might be periodically performed by an installed collector to identify new meters 114 that have been brought on-line since the last node scan and to allow registered meters to switch to a different path.

In addition to the full node scan, collector 116 may also perform a process of scanning specific meters 114 in the subnet 120, which is referred to as a "node scan retry." For example, collector 116 may issue a specific request to a meter 114 to perform a node scan outside of a full node scan when on a previous attempt to scan the node, the collector 116 was unable to confirm that the particular meter 114 received the node scan request. Also, a collector 116 may request a node scan retry of a meter 114 when during the course of a full node scan the collector 116 was unable to read the node scan data from the meter 114. Similarly, a node scan retry will be performed when an exception procedure requesting an immediate node scan is received from a meter 114.

The system 110 also automatically reconfigures to accommodate a new meter 114 that may be added. More particularly, the system identifies that the new meter has begun operating and identifies a path to a collector 116 that will become responsible for collecting the metering data. Specifically, the new meter will broadcast an indication that it is unregistered. In one embodiment, this broadcast might be, for example, embedded in, or relayed as part of a request for an update of the real time as described above. The broadcast will be received at one of the registered meters 114 in proximity to the meter that is attempting to register. The registered meter 114 forwards the time to the meter that is attempting to register. The registered node also transmits an exception request to its collector 116 requesting that the collector 116 implement a node scan, which presumably will locate and register the new meter. The collector 116 then transmits a request that the registered node perform a node scan. The registered node will perform the node scan, during which it requests that all unregistered nodes respond. Presumably, the newly added, unregistered meter will respond to the node scan. When it does, the collector will then attempt to qualify and then register the new node in the same manner as described above.

Once a communication path between the collector and a meter is established, the meter can begin transmitting its meter data to the collector and the collector can transmit data and instructions to the meter. As mentioned above, data is transmitted in packets. "Outbound" packets are packets transmitted from the collector to a meter at a given level. In one embodiment, outbound packets contain the following fields, but other fields may also be included:

Length—the length of the packet;
SrcAddr—source address—in this case, the LAN ID of the collector;

DestAddr—the LAN ID of the meter to which the packet addressed;

RptPath—the communication path to the destination meter (i.e., the list of identifiers of each repeater in the path from the collector to the destination node); and Data—the payload of the packet.

The packet may also include integrity check information (e.g., CRC), a pad to fill-out unused portions of the packet and other control information. When the packet is transmitted from the collector, it will only be forwarded on to the destination meter by those repeater meters whose identifiers appear in the RptPath field. Other meters may receive the packet, but meters that are not listed in the path identified in the RptPath field will not repeat the packet.

"Inbound" packets are packets transmitted from a meter at a given level to the collector. In one embodiment, inbound packets contain the following fields, but other fields may also be included:

Length—the length of the packet;

SrcAddr—source address—the LAN ID of the meter that initiated the packet;

DestAddr—the LAN ID of the collector to which the packet is to be transmitted;

RptAddr—an identifier of the parent node that serves as the next repeater for the sending node;

Data—the payload of the packet;

Because each meter knows the identifier of its parent node (i.e., the node in the next lower level that serves as a repeater for the present node), an inbound packet need only identify who is the next parent. When a node receives an inbound packet, it checks to see if the RptAddr matches its own identifier. If not, it discards the packet. If so, it knows that it is supposed to forward the packet on toward the collector. The node will then replace the RptAddr field with the identifier of its own parent and will then transmit the packet so that its parent will receive it. This process will continue through each repeater at each successive level until the packet reaches the collector.

For example, suppose a meter at level three initiates transmission of a packet destined for its collector. The level three node will insert in the RptAddr field of the inbound packet the identifier of the level two node that serves as a repeater for the level three node. The level three node will then transmit the packet. Several level two nodes may receive the packet, but only the level two node having an identifier that matches the identifier in the RptAddr field of the packet will acknowledge it. The other will discard it. When the level two node with the matching identifier receives the packet, it will replace the RptAddr field of the packet with the identifier of the level one node that serves as a repeater for that level two node, and the level two node will then transmit the packet. This time, the level one node having the identifier that matches the RptAddr field will receive the packet. The level one node will insert the identifier of the collector in the RptAddr field and will transmit the packet. The collector will then receive the packet to complete the transmission.

A collector 116 periodically retrieves meter data from the meters that are registered with it. For example, meter data may be retrieved from a meter every 4 hours. Where there is a problem with reading the meter data on the regularly scheduled interval, the collector will try to read the data again before the next regularly scheduled interval. Nevertheless, there may be instances wherein the collector 116 is unable to read metering data from a particular meter 114 for a prolonged period of time. The meters 114 store an indication of when they are read by their collector 116 and keep track of the time since their data has last been collected by the collector 116. If the length of time since the last reading exceeds a defined threshold, such as for example, 18 hours, presumably a problem has arisen in the communication path between the particular meter 114 and the collector 116. Accordingly, the meter 114 changes its status to that of an unregistered meter and attempts to locate a new path to a collector 116 via the process described above for a new node. Thus, the exemplary system is operable to reconfigure itself to address inadequacies in the system.

In some instances, while a collector 116 may be able to retrieve data from a registered meter 114 occasionally, the level of success in reading the meter may be inadequate. For example, if a collector 116 attempts to read meter data from a meter 114 every 4 hours but is able to read the data, for example, only 70 percent of the time or less, it may be desirable to find a more reliable path for reading the data from that particular meter. Where the frequency of reading data from a meter 114 falls below a desired success level, the collector 116 transmits a message to the meter 114 to respond to node scans going forward. The meter 114 remains registered but will respond to node scans in the same manner as an unregistered node as described above. In other embodiments, all registered meters may be permitted to respond to node scans, but a meter will only respond to a node scan if the path to the collector through the meter that issued the node scan is shorter (i.e., less hops) than the meter's current path to the collector. A lesser number of hops is assumed to provide a more reliable communication path than a longer path. A node scan request always identifies the level of the node that transmits the request, and using that information, an already registered node that is permitted to respond to node scans can determine if a potential new path to the collector through the node that issued the node scan is shorter than the node's current path to the collector.

If an already registered meter 114 responds to a node scan procedure, the collector 116 recognizes the response as originating from a registered meter but that by re-registering the meter with the node that issued the node scan, the collector may be able to switch the meter to a new, more reliable path. The collector 116 may verify that the RSSI value of the node scan response exceeds an established threshold. If it does not, the potential new path will be rejected. However, if the RSSI threshold is met, the collector 116 will request that the node that issued the node scan perform the qualification process described above (i.e., send a predetermined number of packets to the node and count the number of acknowledgements received). If the resulting qualification score satisfies a threshold, then the collector will register the node with the new path. The registration process comprises updating the collector 116 and meter 114 with data identifying the new repeater (i.e. the node that issued the node scan) with which the updated node will now communicate. Additionally, if the repeater has not previously performed the operation of a repeater, the repeater would need to be updated to identify that it is a repeater. Likewise, the repeater with which the meter previously communicated is updated to identify that it is no longer a repeater for the particular meter 114. In other embodiments, the threshold determination with respect to the RSSI value may be omitted. In such embodiments, only the qualification of the last "hop" (i.e., sending a predetermined number of packets to the node and counting the number of acknowledgements received) will be performed to determine whether to accept or reject the new path.

In some instances, a more reliable communication path for a meter may exist through a collector other than that with which the meter is registered. A meter may automatically recognize the existence of the more reliable communication path, switch collectors, and notify the previous collector that the change has taken place. The process of switching the registration of a meter from a first collector to a second collector begins when a registered meter 114 receives a node scan request from a collector 116 other than the one with which the meter is presently registered. Typically, a registered meter 114 does not respond to node scan requests. However, if the request is likely to result in a more reliable transmission path, even a registered meter may respond. Accordingly, the meter determines if the new collector offers a potentially more reliable transmission path. For example, the meter 114 may determine if the path to the potential new collector 116 comprises fewer hops than the path to the collector with which the meter is registered. If not, the path may not be more reliable and the meter 114 will not respond to the node scan. The meter 114 might also determine if the RSSI of the node scan packet exceeds an RSSI threshold identified in the node scan information. If so, the new collector may offer a more reliable transmission path for meter data. If not, the transmission path may not be acceptable and the meter may not respond. Additionally, if the reliability of communication between the potential new collector and the repeater that would service the meter meets a threshold established when the repeater was registered with its existing collector, the communication path to the new collector may be more reliable. If the reliability does not exceed this threshold, however, the meter 114 does not respond to the node scan.

If it is determined that the path to the new collector may be better than the path to its existing collector, the meter 114 responds to the node scan. Included in the response is information regarding any nodes for which the particular meter may operate as a repeater. For example, the response might identify the number of nodes for which the meter serves as a repeater.

The collector 116 then determines if it has the capacity to service the meter and any meters for which it operates as a repeater. If not, the collector 116 does not respond to the meter that is attempting to change collectors. If, however, the collector 116 determines that it has capacity to service the meter 114, the collector 116 stores registration information about the meter 114. The collector 116 then transmits a registration command to meter 114. The meter 114 updates its registration data to identify that it is now registered with the new collector. The collector 116 then communicates instructions to the meter 114 to initiate a node scan request. Nodes that are unregistered, or that had previously used meter 114 as a repeater respond to the request to identify themselves to collector 116. The collector registers these nodes as is described above in connection with registering new meters/nodes.

Under some circumstances it may be necessary to change a collector. For example, a collector may be malfunctioning and need to be taken off-line. Accordingly, a new communication path must be provided for collecting meter data from the meters serviced by the particular collector. The process of replacing a collector is performed by broadcasting a message to unregister, usually from a replacement collector, to all of the meters that are registered with the collector that is being removed from service. In one embodiment, registered meters may be programmed to only respond to commands from the collector with which they are registered. Accordingly, the command to unregister may comprise the unique identifier of the collector that is being replaced. In response to the command to unregister, the meters begin to operate as unregistered meters and respond to node scan requests. To allow the unregister command to propagate through the subnet, when a node receives the command it will not unregister immediately, but rather remain registered for a defined period, which may be referred to as the "Time to Live". During this time to live period, the nodes continue to respond to application layer and immediate retries allowing the unregistration command to propagate to all nodes in the subnet. Ultimately, the meters register with the replacement collector using the procedure described above.

One of collector's 116 main responsibilities within subnet 120 is to retrieve metering data from meters 114. In one embodiment, collector 116 has as a goal to obtain at least one successful read of the metering data per day from each node in its subnet. Collector 116 attempts to retrieve the data from all nodes in its subnet 120 at a configurable periodicity. For example, collector 116 may be configured to attempt to retrieve metering data from meters 114 in its subnet 120 once every 4 hours. In greater detail, in one embodiment, the data collection process begins with the collector 116 identifying one of the meters 114 in its subnet 120. For example, collector 116 may review a list of registered nodes and identify one for reading. The collector 116 then communicates a command to the particular meter 114 that it forward its metering data to the collector 116. If the meter reading is successful and the data is received at collector 116, the collector 116 determines if there are other meters that have not been read during the present reading session. If so, processing continues. However, if all of the meters 114 in subnet 120 have been read, the collector waits a defined length of time, such as, for example, 4 hours, before attempting another read.

If during a read of a particular meter, the meter data is not received at collector 116, the collector 116 begins a retry procedure wherein it attempts to retry the data read from the particular meter. Collector 116 continues to attempt to read the data from the node until either the data is read or the next subnet reading takes place. In an embodiment, collector 116 attempts to read the data every 60 minutes. Thus, wherein a subnet reading is taken every 4 hours, collector 116 may issue three retries between subnet readings.

Safety Interlocks for Control Relays

Figure 4:
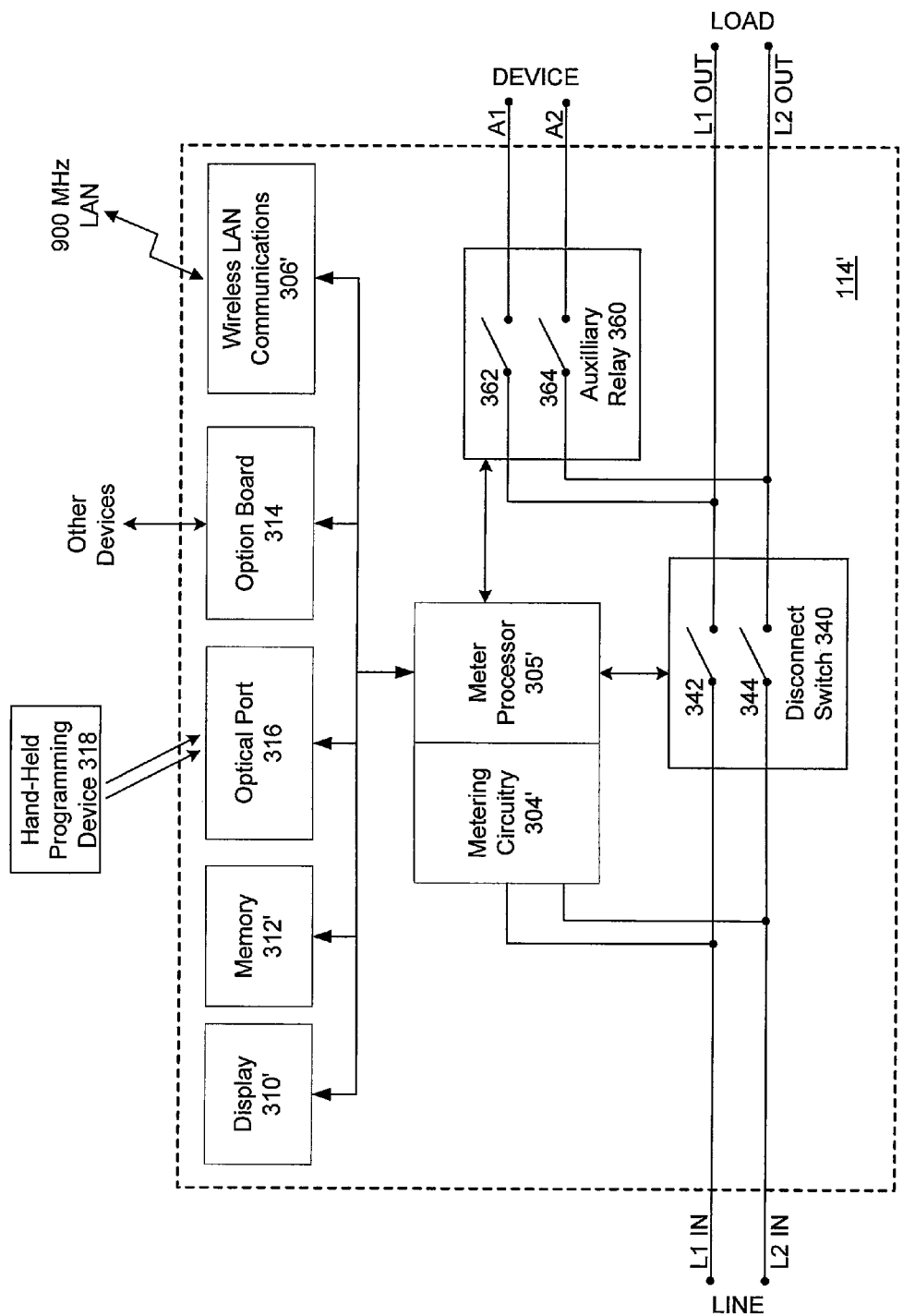
FIG. 4 is a block diagram illustrating another embodiment of an exemplary electricity meter.

FIG. 4 is a block diagram of an electricity meter 114', which may be one of the meters 114 discussed above in connection with FIGS. 1, 2, 3A and 3B. In addition to the metering circuitry 304', processor 305', wireless LAN communications 306', display 310' and memory 312' already discussed above in connection with the meter 114 of FIG. 3B, the electricity meter 114' may also comprise one or more option boards 314 that may be installed or connected in the meter 114' and that may provide additional functionality to the meter 114' as well as enabling the meter 114' to communicate with other devices via a wired or wireless connection (different from that provided by the wireless LAN communications circuitry 306'). The meter 114' may also comprise an optical port or interface 316 that enables other devices, such as a hand-held programming device 318, to communicate with the meter via light transmission. Such optical ports are common features of many commercially available metering devices. Some hand-held programming devices may be designed to communicate with the meter via its wireless LAN communications circuitry 306'.

The meter 114' may also comprise one or more control relays. In the embodiment illustrated in FIG. 4, the meter 114' includes a first control relay 340, referred to herein as a disconnect switch, which may include two electromechanical solenoid driven switches 342 and 344, one for each set of input and output contacts L1 IN/L1 OUT and L2 IN/L2 OUT of the meter. As is common in many meter installations, the meter may be connected between a power line (LINE) and a load (LOAD) at a subscriber location. In a single-phase installation, the meter may be connected to the power line at contacts L1 IN and L2 IN, and it may be connected to the load at contacts L1 OUT and L2 OUT. In other installations, such as certain polyphase installations, there may be additional lines input to the meter and output from the meter, and the disconnect switch 340 may have additional solenoid driven switches (not shown) for those additional lines.

The disconnect switch 340 has a first state in which it is open (i.e., switches 342, 344 are open) and a second state in which it is closed. The state of the disconnect switch may be controlled by the processor 305'. When the disconnect switch 340 is closed, electrical energy should be delivered to the load at the subscriber location via the output contacts (L1 OUT; L2 OUT). When the disconnect switch 340 is open (i.e., switches 342 and 344 are open as shown in FIG. 4), no electrical energy should be delivered to the load.

The meter 114' may include one or more additional control relays, such as auxiliary control relay 360, which like the disconnect switch 340, may include a pair of solenoid driven switches 362 and 364. Alternatively, the auxiliary control relay 360 may comprise a solid state relay (not shown) rather than a mechanical relay. Like the disconnect switch 340, the auxiliary relay 360 may have a first state in which it is open (i.e., switches 362, 364 are open), and a second state in which it is closed. The state of the auxiliary control relay 360 may be controlled by the processor 305'. The auxiliary control relay 360 may be operated (opened or closed) in order to control the delivery of electrical energy to a particular device, such as a water heater or other appliance, via auxiliary output contacts A1 and A2. When the auxiliary control relay 360 is closed, electrical energy should be delivered to the device at the subscriber location via the output contacts (A1; A2). When the auxiliary control relay 360 is open (i.e., switches 362 and 364 are open as shown in FIG. 4), no electrical energy should be delivered to the device.

Figure 5:
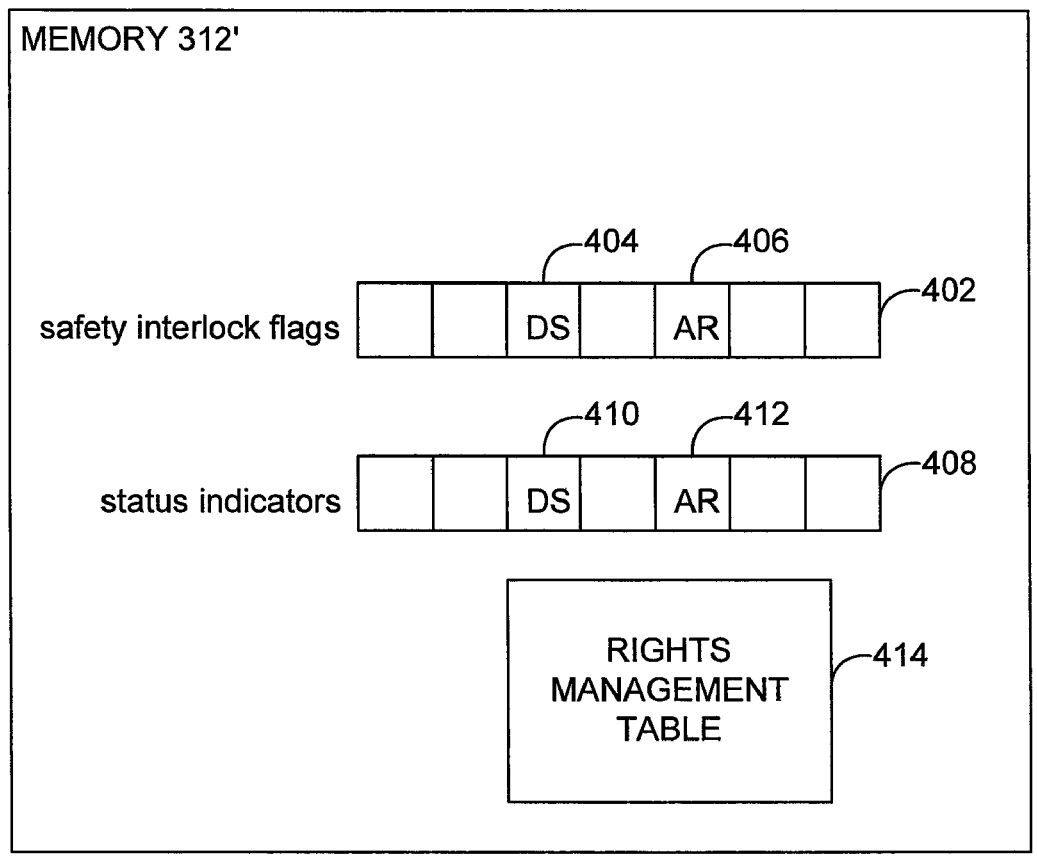
FIG. 5 is a block diagram illustrating one embodiment of a memory configuration of the electricity meter of FIG. 4.

With reference to FIG. 5, according to the safety interlock feature described herein, in one embodiment, the memory 312' of the meter 114' may store one or more safety interlock flags 402. There may be a different safety interlock flag for each of the different control relays in the meter. For example, the disconnect switch 340 may have a flag 404 associated with it, and the auxiliary control relay 360 may have a different flag 406 associated with. Each flag may indicate for its respective control relay whether changes to the state of that control relay are permitted or not. In one embodiment, each flag may comprise a single bit where, for example, a value of 1 indicates that changes to the state of the control relay are not permitted, and a value of 0 indicates that changes are permitted. In other embodiments, each flag may comprise additional bits or values to represent these permissions. Additionally, in another embodiment, all of the control relays may be associated with a single flag, or certain groups of two or more control relays may be associated with a respective flag.

The memory 312' may also store one or more status indicators 408. There may be a different status indicator for each of the different control relays in the meter. For example, the disconnect switch 340 may have a status indicator 410, and the auxiliary control relay 360 may have a status indicator 412. Each status indicator may indicate the present state of the respective control relay, such as whether it is opened or closed. In one embodiment, each status indicator may comprise a single bit where, for example, a value of 1 indicates that the control relay is in its open state, and a value of 0 indicates that the control relay is in its closed state. In other embodiments, each status indicator may comprise additional bits or values and may provide additional status information. The status indicator(s) may be polled (i.e., read or requested to read) by a person, entity, or device, via any one or more of the communications interfaces 306', 314, 316 of the meter. The status indicator(s) may also be displayed on the meter display 310'.

The memory 312' may further store information indicating whether various persons, entities, devices and/or particular types of communications interface in the meter (such as the optical port 316, option board 314, wireless LAN communications 306', etc.) are permitted to change the state of the safety interlock flag associated with one or more of the control relays. In one embodiment, this information may be provided in the form of a rights management table comprising one or more entries. Each entry may identify the particular person, entity, device or communications interface, along with an indication of whether that person, entity, device or communications interface (or a request received via that person, entity, device or communications interface) has permission to change the state of any one or more of the safety interlock flags associated with their respective control relays. A person or entity may be identified in the table by a unique identifier or code. For example, a person may have an employee identification number, and a particular utility may have some unique identifier of that utility. Similarly, a device may have a unique serial number, and a particular communications interface (option board, optical port, wireless LAN communications circuitry) may have a serial number or a type identifier that is used to identify it in the rights management table. The rights management table may also contain information concerning other rights or permissions of the person, entity, device or communications interface.

In other embodiments, the safety interlock flag(s), status indicator(s) and/or rights management table may be stored in locations other than the memory 312', such as other control registers or special-purpose memory devices. As used in the claims, the term "memory" is intended to encompass any such storage.

Figure 6:
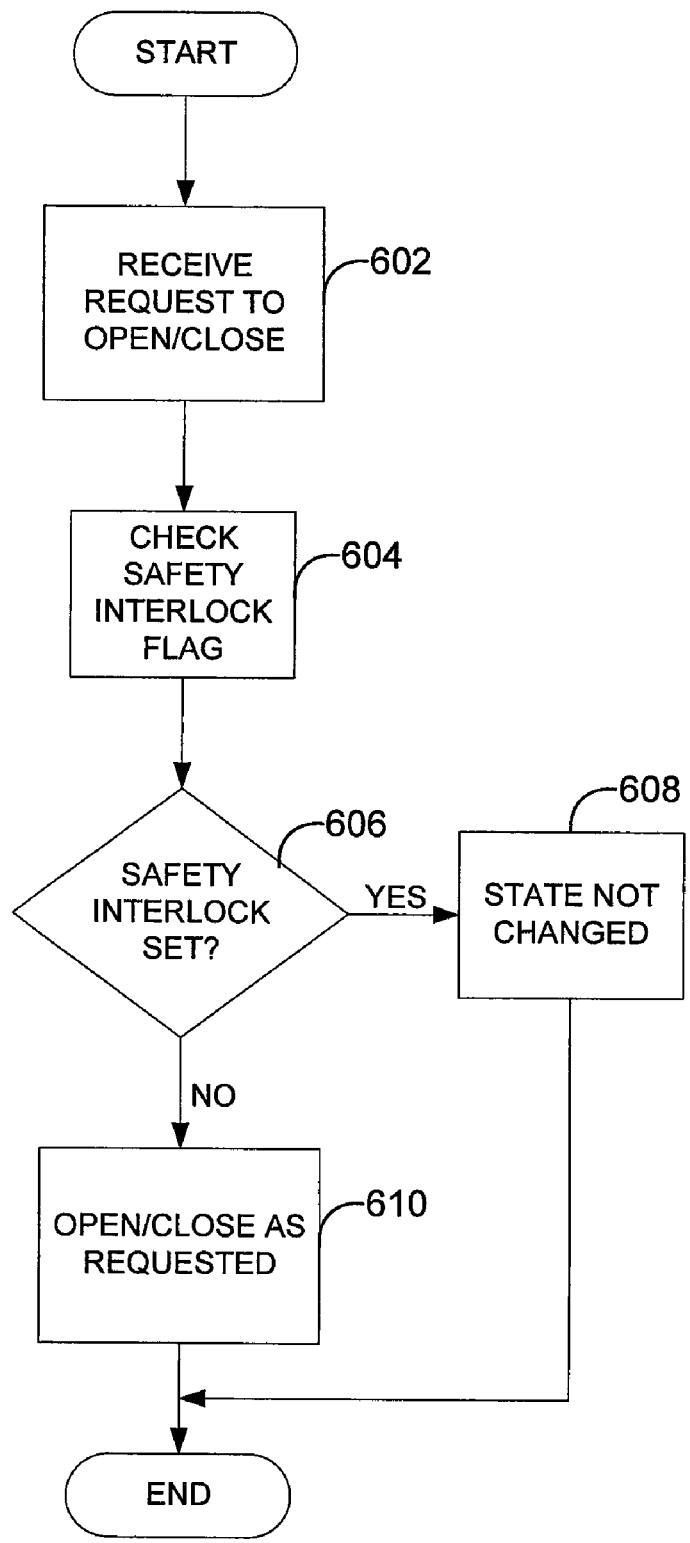
FIG. 6 is a flow diagram of one embodiment of a method of setting/resetting a safety interlock for a disconnect switch or relay.

Further according to the safety interlock feature described herein, the processor 305' may operate as illustrated in FIG. 6. At step 602, the processor 305' may receive a request to change the state of (i.e., to open or close) a control relay, such as the disconnect switch 340 or the auxiliary control relay 360. The request may have been received by any one of the communications interfaces of the meter 114', such as from the optical port 316, the wireless LAN communications circuitry 306' or an option board 314. The request may identify the source of the request, such as a person, an entity, a device (such as hand-held programming device 318) or the particular communications interface over which the request was received (optical port 316, option board 314, wireless circuitry 306', etc.). For example, a utility may issue the request from its network management system 204 (FIG. 2) and the request may be transmitted to the meter in accordance with the network communications described above in connection with FIGS. 1-3B. Alternatively, a technician may use a hand-held programming device 318 to issue such a request via the optical port 316 of the meter or, alternatively, via the wireless LAN communications circuitry 306'.

At step 604, the processor 305' accesses the safety interlock flag associated with the particular control relay to determine whether it indicates that changes to the state of the control relay are permitted or not. For example, where the flag comprises a single bit, a value of 1 (i.e., the flag is "set") may indicate that changes to the state of the control relay are not permitted, whereas a value of 0 (i.e., the flag is "reset") may indicate that changes to the state of the control relay are not permitted. In step 606, if the safety interlock flag indicates that changes to the state of the control relay (i.e., opening it or closing it) are not permitted, then control passes to step 608, in which the request to change the state of the control relay is not performed. The request may be ignored, or an indication that it has been denied may be issued. If, however, the safety interlock flag indicates that changes to the state of the control relay are permitted, then control passes to step 610 where the request is performed, i.e., the control relay is opened or closed as requested. The steps of FIG. 6 may be performed separately for each different control relay of the meter. As can be appreciated, the safety interlock may be used to provide an additional level of control over changes to the state of a control relay to enhance safety.

Figure 7:
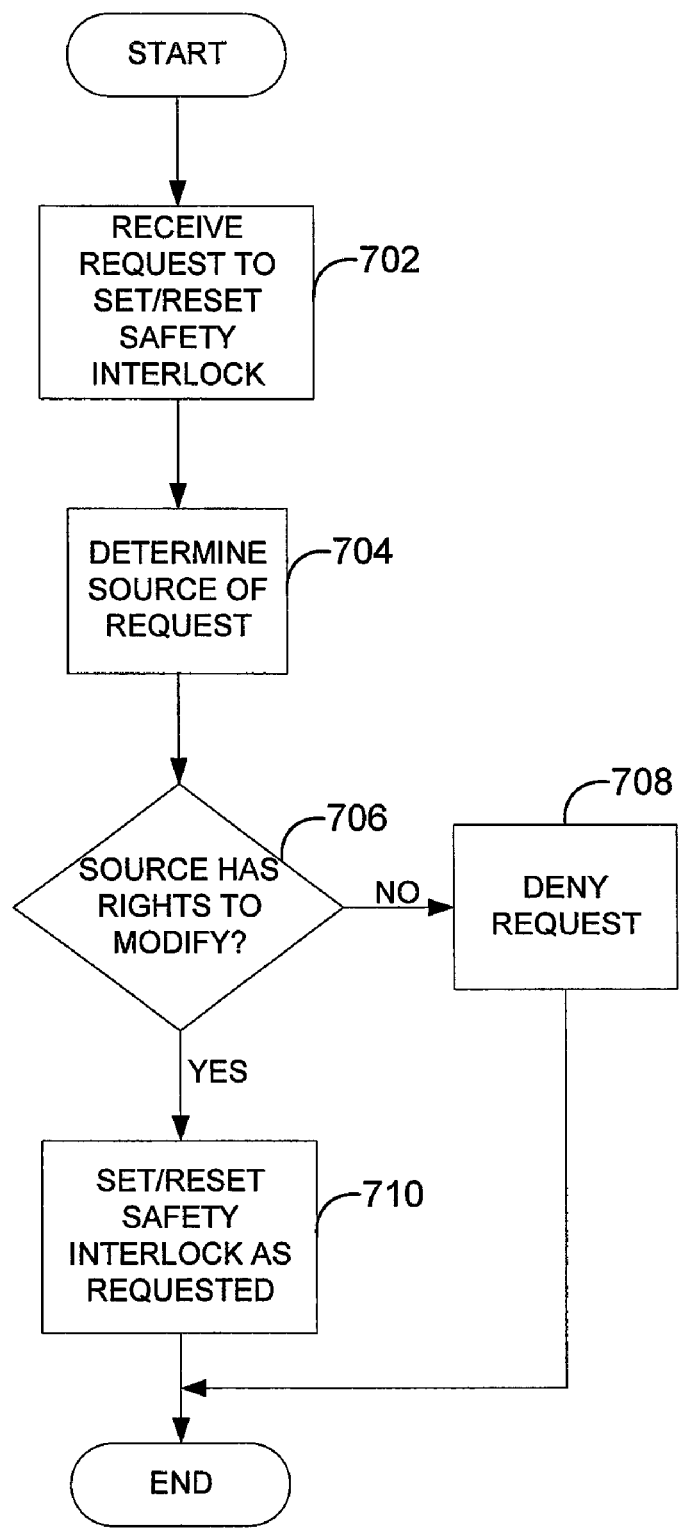
FIG. 7 is a flow diagram of one embodiment of a method of processing a request to open or close a disconnect switch or relay.

According to another aspect of the safety interlock feature, changes to the state of each safety interlock flag may also be controlled, as illustrated in FIG. 7. At step 702, the processor 305' may receive a request to change the state of one of the safety interlock flags, such as the safety interlock flag 404 associated with the disconnect switch 340 or the safety interlock flag 406 associated with the auxiliary control relay 360. The request may have been received by any one of the communications interfaces of the meter 114', such as from the optical port 316, the wireless LAN communications circuitry 306' or an option board 314. The request may identify the source of the request, such as a person, an entity, a device (such as hand-held programming device 318) or the particular communications interface over which the request was received (optical port 316, option board 314, wireless circuitry 306', etc.).

In step 704, the processor 305' may determine the sender from the identifier of the source provided in the request. At step 706, the processor 305' may access the rights management table 414 to locate an entry in the table associated with the identified source of the request. If the entry indicates that the source of the request does not have permission to change the state of the safety interlock flag, or no entry for the source can be found in the table, then control passes to step 708 where the request is not performed. It may be ignored, or an indication that is was denied may be transmitted back to the source. If, however, the rights management table (or other information) does indicate that the source has permission to change the state of the safety interlock flag, then the request is performed at step 710. An acknowledgment may be transmitted back to the sender. The steps of FIG. 7 may be performed separately for each different safety interlock flag and/or request to change the flag.

In one embodiment, a request to change the state of the safety interlock flag and/or a request to change the state of a particular control relay may be received in encrypted form. In such a case, the processor 305' may decrypt the request before performing the steps of FIG. 6 or 7.

In yet another embodiment, in addition to storing information indicating whether various persons, entities, devices and/or particular types of communications interfaces in the meter (such as the optical port 316, option board 314, wireless LAN communications 306', etc.) are permitted to change the state of the safety interlock flag associated with one or more of the control relays, the memory 312' of the meter 114' may also store information (permissions) indicating whether any of those persons, entities, devices and/or particular types of communications interfaces are permitted to change the state of any of the control relays. In an embodiment in which this information is provided in the form of a rights management table comprising one or more entries for each person, entity, device or communications interface, the entry for a given person, entity, device or communications interface may include the permissions for changing the safety interlock flags for any control relays, as well as permissions for changing the state of any of those control relays as well. In this alternative embodiment, prior to performing step 610 (or alternatively prior to performing step 604), the processor 305' may search the rights management table for an entry corresponding to an identifier of the source of the request to change the state of the particular control relay to determine whether that source has permission to change the state of the relay. If the source has permission, then the process illustrated in FIG. 6 may proceed as described above. However, if the source does not have permission, then control may pass to step 608.

All or portions of the various systems, methods, and aspects of the safety interlock feature may be embodied in hardware, software, or a combination of both. When embodied in software, the methods and apparatus of the present invention, or certain aspects or portions thereof, may be embodied in the form of program code (i.e., computer executable instructions). For example, the steps of FIGS. 6 and 7 performed by the processor 305' may be embodied in the form of program code (processor or computer executable instructions). This program code may be stored on a computer-readable medium, such as a magnetic, electrical, or optical storage medium, including without limitation, a floppy diskette, CD-ROM, CD-RW, DVD-ROM, DVD-RAM, magnetic tape, flash memory, hard disk drive, or any other machine-readable storage medium, wherein, when the program code is loaded into and executed by a machine, such as a computer or server, the machine becomes an apparatus for practicing the invention. A device on which the program code executes, such as meter 114', will generally include a processor, a storage medium readable by the processor (including volatile and non-volatile memory and/or storage elements), at least one input device, and at least one output device. The program code may be implemented in a high level procedural or object oriented programming language. Alternatively, the program code can be implemented in an assembly or machine language. In any case, the language may be a compiled or interpreted language. When implemented on a general-purpose processor, the program code may combine with the processor to provide a unique apparatus that operates analogously to specific logic circuits.

As the foregoing illustrates, the safety interlock feature described herein provides enhanced safety in an electricity metering environment. While methods, systems and apparatus have been described and illustrated with reference to specific embodiments, modifications and variations may be made without departing from the principles described above and set forth in the following claims. Accordingly, reference should be made to the following claims as describing the scope of the present invention.

What is claimed is:

1. In an electricity meter comprising a processor, a memory, a communication interface, and at least one control relay that has a first state in which the control relay is open and a second state in which the control relay is closed, the state of the control relay being controlled by the processor, a method comprising:

receiving a request via the communications interface to change a state of the at least one control relay;

checking a state of a safety interlock flag stored in the memory of the electricity meter, the safety interlock flag indicating whether or not changes to the state of the at least one control relay are permitted; and changing the state of the at least one control relay in response to the received request, only if the state of the safety interlock flag indicates that changes are permitted, but otherwise not changing the state of the at least one control relay.

2. The method recited in claim 1, wherein the communications interface via which the request to change the state of the at least one control relay comprises an optical port of the electricity meter, an option board connected to the electricity meter, or a wireless communications interface.

3. The method recited in claim 1, wherein the at least one control relay comprises a disconnect switch or an auxiliary control relay.

4. The method recited in claim 1, wherein the at least one control relay comprises a plurality of control relays, and wherein there is stored in the memory a respective safety interlock flag for each of the control relays, and further wherein said receiving, checking and changing steps are performed independently for each control relay and its respective safety interlock flag.

5. The method recited in claim 1, further comprising:
receiving a request to change the state of the safety interlock flag stored in the memory of the electricity meter and an identification of a source of the request;
determining from information stored in the memory of the electricity meter whether the source of the request is permitted to change the state of the safety interlock flag; and
changing the state of the safety interlock flag as requested, only if it is determined that the source of the request is permitted to change the state of the safety interlock flag.

6. The method recited in claim 5, wherein the request to change the state of the safety interlock flag is received in encrypted form, and wherein the method further comprises decrypting the request.

7. The method recited in claim 5, wherein the step of determining from information stored in the memory of the electricity meter whether the source of the request is permitted to change the state of the safety interlock flag comprises:
comparing the identifier of the source of the request to entries in a rights management table;
locating an entry corresponding to the identifier of the source of the request; and
determining from the located entry whether the source is permitted to change the state of the safety interlock flag.

8. The method recited in claim 5, wherein the source of the request to change the state of the safety interlock flag comprises a person, an entity, a device or a particular type of communications interface over which the request is received.

9. The method recited in claim 1, wherein the request to change the state of the at least one control relay is received in encrypted form, and wherein the method further comprises decrypting the request.

10. The method recited in claim 1, further comprising:
receiving an identification of a source of the request to change the state of the at least one control relay; and
prior to changing the state of the at least one control relay:
determining from information stored in the memory of the electricity meter whether the source of the request is permitted to change the state of the at least one control relay; and
changing the state of the at least one control relay as requested, only if it is determined that the source of the request is permitted to change the state of the at least one control relay.

11. The method recited in claim 10, wherein the step of determining from information stored in the memory of the electricity meter whether the source of the request is permitted to change the state of the at least one control relay comprises:
comparing the identifier of the source of the request to entries in a rights management table;
locating an entry corresponding to the identifier of the source of the request; and
determining from the located entry whether the source is permitted to change the state of the at least one control relay.

12. An electricity meter comprising:
at least one control relay that has a first state in which the control relay is open and a second state in which the control relay is closed;
a memory containing a safety interlock flag having a state that indicates whether or not changes to the state of the at least one control relay are permitted;
a communications interface adapted to receive a request to change the state of the at least one control relay; and
a processor that controls the state of the control relay, the processor operating to receive a request via the communications interface to change the state of the at least one control relay, to check the state of the safety interlock flag stored in the memory of the electricity meter and to determine therefrom whether or not changes to the state of the at least one control relay are permitted, and to change the state of the at least one control relay in response to the received request, only if the state of the safety interlock flag indicates that changes are permitted, but otherwise to not change the state of the at least one control relay.

13. The electricity meter recited in claim 12, wherein the communications interface via which the request to change the state of the at least one control relay comprises an optical port of the electricity meter, an option board connected to the electricity meter, or a wireless communications interface.

14. The electricity meter recited in claim 12, wherein the at least one control relay comprises a disconnect switch or an auxiliary control relay.

15. The electricity meter recited in claim 12, wherein the at least one control relay comprises a plurality of control relays, and wherein there is stored in the memory a respective safety interlock flag for each of the control relays, and further wherein the processor performs the receive, check and change functions independently for each control relay and its respective safety interlock flag.

16. The electricity meter recited in claim 12, wherein the processor further operates to receive a request to change the state of the safety interlock flag stored in the memory of the electricity meter and an identification of a source of the request, to determine from information stored in the memory of the electricity meter whether the source of the request is permitted to change the state of the safety interlock flag, and to change the state of the safety interlock flag as requested, only if it is determined that the source of the request is permitted to change the state of the safety interlock flag.

17. The electricity meter recited in claim 16, wherein the request to change the state of the safety interlock flag is received in encrypted form, and wherein the processor further operates to decrypt the request.

18. The electricity meter recited in claim 16, wherein the processor determines from information stored in the memory of the electricity meter whether the source of the request is permitted to change the state of the safety interlock flag by (i) comparing the identifier of the source of the request to entries in a rights management table; (ii) locating an entry corresponding to the identifier of the source of the request; and (iii) determining from the located entry whether the source is permitted to change the state of the safety interlock flag.

19. The electricity meter recited in claim 16, wherein the source of the request to change the state of the safety interlock flag comprises a person, an entity, a device or a particular type of communications interface over which the request is received.

20. The electricity meter recited in claim 12, wherein the request to change the state of the at least one control relay is received in encrypted form, and wherein the processor further operates to decrypt the request.

21. The electricity meter recited in claim 12, wherein the processor further operates to receive an identification of a source of the request to change the state of the at least one control relay, and prior to changing the state of the at least one control relay, still further operates to (i) determine from information stored in the memory of the electricity meter whether the source of the request is permitted to change the state of the at least one control relay; and (ii) change the state of the at least one control relay as requested, only if it is determined that the source of the request is permitted to change the state of the at least one control relay.

22. The electricity meter recited in claim 21, the processor determines from information stored in the memory of the electricity meter whether the source of the request is permitted to change the state of the at least one control relay by (i) comparing the identifier of the source of the request to entries in a rights management table; (ii) locating an entry corresponding to the identifier of the source of the request; and (iii) determining from the located entry whether the source is permitted to change the state of the at least one control relay.

* * * * *